United States Patent [19]

Lewis et al.

[11] Patent Number: 4,560,576
[45] Date of Patent: Dec. 24, 1985

[54] METHOD OF COATING OPTICAL COMPONENTS

[75] Inventors: Keith L. Lewis; James A. Savage, both of Malvern, England

[73] Assignee: The Secretary of State for Defence in Her Britannic Majesty's Government of the United Kingdom of Great Britain and Northern Ireland, London, England

[21] Appl. No.: 668,818

[22] Filed: Nov. 6, 1984

[30] Foreign Application Priority Data

Nov. 11, 1983 [GB] United Kingdom ............... 8330126

[51] Int. Cl.$^4$ ............................................. G02B 1/10
[52] U.S. Cl. .................................... 427/38; 427/53.1; 427/160; 427/164; 427/166; 204/192 N; 204/192 P
[58] Field of Search ............... 427/38, 53.1, 160, 164, 427/166; 204/192 P, 192 N

[56] References Cited

U.S. PATENT DOCUMENTS 4,400,254 8/1983 Freller et al. ............... 204/192 P

Primary Examiner—James R. Hoffman
Attorney, Agent, or Firm—William R. Hinds

[57] ABSTRACT

A coating having low absorbance of laser energy is provided on optical components substrates by molecular beam epitaxial growth techniques.

The growth conditions prevent contamination of substrate and coating with water and carbonaceous gases. The method of coating has the following steps:

arranging the substrate in a vacuum chamber, cleaning the component while holding the pressure below $10^{-4}$ millibar and the partial pressure of $H_2O$ and carbonaceous gases below $4.10^{-9}$ mb, applying at least one layer of a coating material to the substrate, while holding the pressure below $10^{-8}$ mb and the partial pressure of $H_2O$ and carbonaceous gases below $4.10^{-9}$ mb.

The optical component may be lenses, windows, or reflectors e.g. of ZnSe, GaAs, glass, etc. The coating may be of selenide e.g. ZnSe, etc.

9 Claims, 1 Drawing Figure

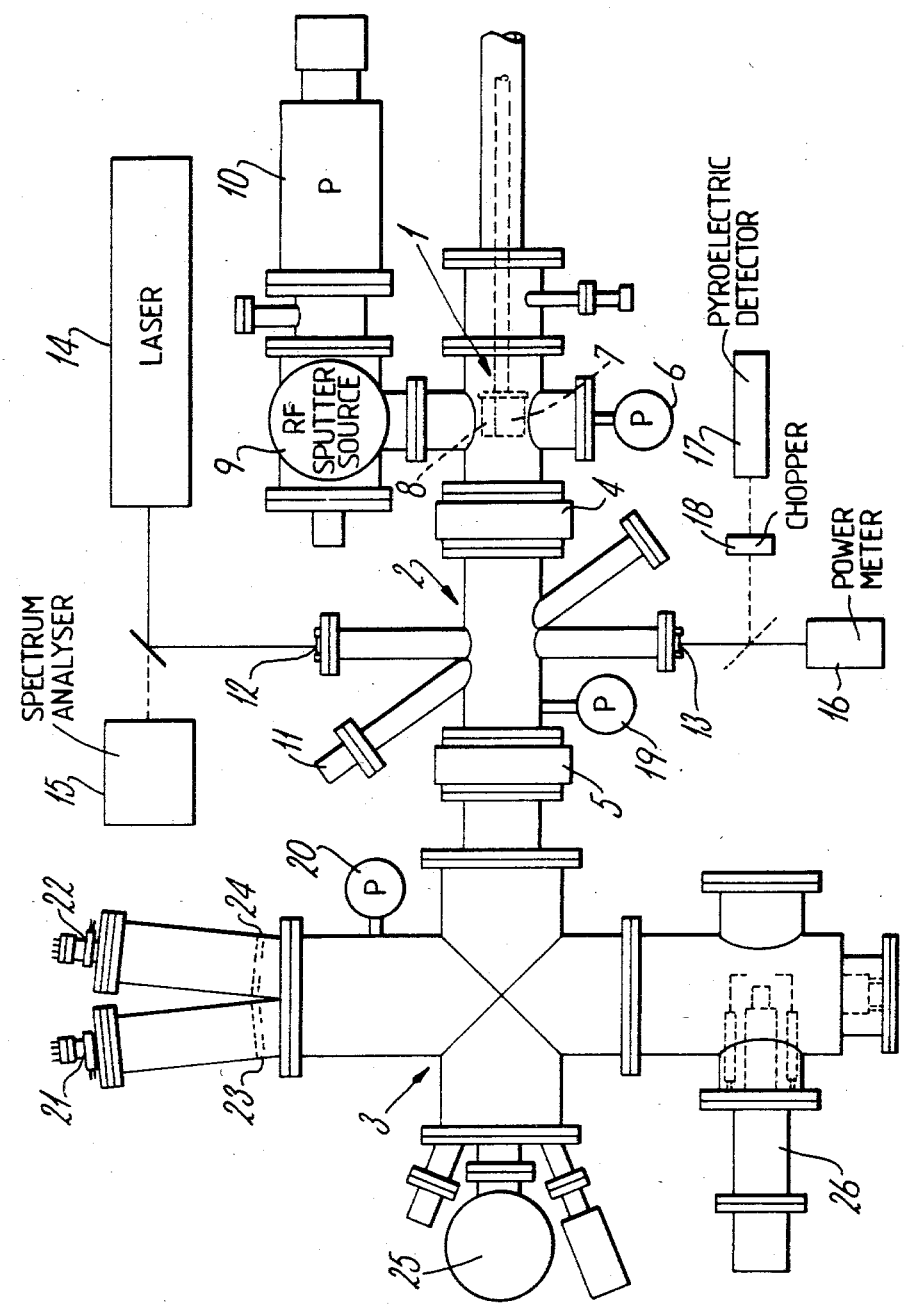

METHOD OF COATING OPTICAL COMPONENTS

This invention relates to a method of coating components such as lenses, windows, and mirrors for optical applications, particularly for laser systems.

The optical components in e.g. laser systems are coated usually with multiple layers to provide the required optical performance. For high energy lasers it is extremely difficult to provide suitable coatings because the coatings as produced absorb too much laser energy. As a result they are subject to laser induced damage.

Various coating materials are generally used but have shortcomings. For example ZnSe has been grown in thin films but shows an effective absorption co-efficient in the range 1 to 20 $cm^{-1}$. This compares with a co-efficient of 0.0005 $cm^{-1}$ in bulk ZnSe material grown by chemical vapour deposition.

Different coating techniques have been used to grow thin film coatings. For example thermal evaporation and various forms of plasma deposition/sputtering have been used with varying degrees of success. All these techniques have provided coatings with various defects e.g. micro pores, cracks, poor adhesion, high internal stress, high optical absorbance, low laser induced damage threshold, drift of optical characteristics with time, etc.

According to this invention the problems of providing a coating for optical components of a high power laser system are overcome by growing the coatings in a molecular beam epitaxial apparatus under conditions which prevent component and coating being contaminated with residual impurities such as water and carbonaceous gases.

According to this invention a method of coating an optical component substrate comprises the steps of arranging the substrate in a vacuum chamber, cleaning the component whilst holding the pressure below $10^{-4}$ millibar and the partial pressure of $H_2O$ and carbonaceous gases below $4.10^{-9}$ mb, applying at least one layer of a coating material to the substrate, whilst holding the pressure below $10^{-8}$ mb and the partial pressure of $H_2O$ and carbonaceous gases below $4.10^{-9}$ mb.

Preferably the vacuum during cleaning is about $5.10^{-5}$ mb and the $H_2O$ partial pressure is about $2.10^{-9}$ mb.

Preferably the vacuum during coating is about $8.10^{-9}$ mb and the $H_2O$ partial pressure is about $2.10^{-10}$ mb.

The cleaning step under vacuum conditions may be by an ion/neutral atom beam or laser source and may be in the presence of small amounts of argon. Alternatively a thermal cleaning process may be used in which the substrate is heated at temperature up to 600° C. for e.g. hour.

Preferably the substrate is transferred to a second vacuum chamber, connected to an initial vacuum chamber, for the cleaning step.

After an ion beam etch the substrate may be heated for a time to anneal out damage caused by the ion beam.

The coating layer may be applied from molecular beam ovens, e.g. using Knudsen Ovens, with a solid, liquid, or gaseous source, or may be applied by an A.C. or D.C. sputtering process.

The optical components may be lenses, windows, or reflectors formed of halides (e.g. KCl, $MgF_2$), chalcogenide (e.g. ZnS, ZnSe, selenide glasses), Ge, Si, $Al_2O_3$, $MgO_2$, AlON, GaAs, oxides and metals in amorphous, glassy, polycrystalline or single crystal forms.

The coating may be of oxide, chloride, fluoride, sulphide, selenide, telluride, boride, phosphide, carbide, carbon, nitride, arsenide, bromide, iodide or thallium containing materials, and mixtures of layers of these materials deposited as amorphous, glassy, polycrystalline, or single crystalline layers on the above component material.

The invention will now be described, by way of example only with reference to the accompanying drawing which is a diagrammatic representation of an ultra-high vacuum growth apparatus.

As shown the apparatus is divided into three sections, a loading chamber 1, a sample preparation chamber 2, and a growth chamber 3, each separated by gate valves 4, 5. The chambers are separately bakeable as required to minimise contamination from residual hydrocarbon species and water vapour.

The loading chamber 1 is capable of being pumped down to $10^{-8}$ mb typically $5.10^{-7}$ mb by a liquid nitrogen-trapped polyphenyl ether diffusion pump 6. Inside the loading chamber 1 is a holder 7 which carries an optical component substrate 8 for coating. This holder 7 can be transferred between all three chambers and may incorporate a resistive electrical heater and temperature sensor e.g. platinum resistance thermometer.

An RF sputter source 9 connects with the loading chamber and is used to deposit refractory materials e.g. oxides and nitrides. A separate ultra high vacuum cryopump 10 ensures maintenance of an ultra clean environment and provides the ability to deal with a high throughput of sputtering gas.

The preparation chamber 2 is capable of sustaining a base pressure of $10^{-8}$ mb. It contains a scanning argon ion beam gun 11 for substrate cleaning. Windows 12, 13 of ZnSe allow transmission and absorption measurements of the substrate 8 to be carried out with a $CO_2$ laser 14. Ancilliary components necessary for these measurements include a spectrum analyser 15, a power meter 16, and a pyro-electric detector 17 via a chopper 18. A pump 19 maintains the pressure typically at $5.10^{-5}$ mb with a flow of argon gas during cleaning.

The growth chamber 3 is capable of sustaining a base pressure of around $5.10^{-11}$ mb. It is pumped by one or more ion pumps 20 supplemented by a liquid nitrogen cooled titanium sublimation pump (not shown). Knudsen ovens e.g. 21, 22 are arranged on the growth chamber 3 so that their effusing beams converge at a common focal point. These ovens 21, 22 are conventional items using high purity graphite or boron nitride crucibles containing growth material in a solid or liquid form. Heating wires (not shown) in the ovens control the output of each oven. Shutters 23, 24 are movable independently to pass or block the output from each oven 21, 22. Conventional Auger Electron Spectroscopy equipment 25 fixed to the growth chamber 3 allows chemical analysis of substrates and coating surfaces. A molecular-beam sampling mass spectrometer 26 allows analysis of the fluxes of material effusing from the Knudsen ovens and characterisation of the residual atmosphere of the growth chamber.

A coating of for example ZnSe may be grown on a substrate of glass, GaAs, and ZnSe as follows.

The substrate is carefully cleaned for example with trichloroethane and then by acetone prior to loading into the loading chamber 1. Pressure in the loading chamber 1 is reduced to $5.10^{-7}$ mb and held for around 30 minutes. Alternatively, or in addition, the substrate may be heated up to about 200° C. by a radiant heater (not shown). This removes most of the water from the substrate surface, pores, and cracks, and from the load chamber 1 walls. Even at this low pressure outgassing from the loading chamber walls continues for some hours and will contaminate the substrate 8. Only a few angstroms of H$_2$O in the substrate surface will produce absorption at 10.6 μm or 2.8 μm wavelengths.

The substrate 8 and holder 7 is then transferred into the preparation chamber 2 held at a pressure of around $5.10^{-8}$ mb. This preparation chamber 2, together with the growth chamber 3 will have been maintained at low vacuum condition for some days so that partial pressures of H$_2$O or carbonaceous gases are less than $2\times10^{-10}$ mb.

Surface contaminants on the substrate 8 are removed by 0–3 kV Ar ion beam bombardment for around 10 minutes at a density of about 200 μA/cm$^2$. Argon gas is flowed through the preparation chamber 2 during cleaning at a pressure of typically $5.10^{-5}$ mb. The partial pressure of H$_2$O and carbon gases is maintained near $2.10^{-10}$ mb during and after the cleaning. The optical absorbance of the substrate can then be measured in situ by laser calorimetry e.g. as described by R. Gibbs and K. L. Lewis: J. Phys. E. Sci. Instrum. 11 304 (1978).

After cleaning the substrate 8 and holder 7 are transferred into the growth chamber 3 held at a vacuum of around $8.10^{-9}$ mb. Cleanliness of the substrate surface is monitored by the in situ Auger analysis facility 25. The substrate 8 is typically held around 175° C. by the substrate holder heater during growth of ZnSe coating layers.

The Knudsen ovens 21, 22 are brought up to around 950° C. and the shutters 23, 24 opened to allow molecular beams of Zn and Se to impinge on the substrate. Inside the ovens 21, 22 are polycrystalline lumps of high purity ZnSe carefully prepared e.g. by vapour deposition from mixtures of zinc vapour and hydrogen selenide—as described by K. L. Lewis and G. S. Arthur, Proc. Boulder Laser Damage Symposium 1982, N.B.S. Special Publication 669 8b (1984).

Typically the residual partial pressures are: H$_2$=$8.10^{-9}$ mb, H$_2$O=$2.10^{-10}$ mb, CO=$2.10^{-10}$ mb.

Under these conditions the growth rate of ZnSe is around 1.2 μm/hour and the product is of polycrystalline form. At any time the growth process may be interrupted to allow the surface to be monitored by the Auger Electron Spectrometer 25. This allows precise control of the coating composition by e.g. varying the Knudsen Oven temperature since when growing ternary materials the composition is critically dependent on oven temperature.

Using the above process a ZnSe substrate 8 coated with a ZnSe layer was found to have the same absorptance as the substrate prior to coating. For example a 3 mm thick sample of ZnSe had an absorptance of 0.0019; no measurable change was found after coating with a 1.7 μm thick layer of ZnSe. In contrast the absorptance would be expected to increase by 0.002 had the ZnSe coating been produced by conventional techniques.

It has now been determined that these ZnSe coatings have a very high laser damage threshold (60–73 J/cm$^2$ for pulse length 33 n sec and spot size (full width half maximum) of 102 μm at 10.6 μm). Previous reported values for RF sputtered films are ~20 J/cm$^2$. Cross sectional transmission electron micrographs show that such coatings are polycrystalline but do not contain voids. Their refractive indices are within 0.4% of that of bulk C.V.D. ZnSe.

Multiple layers of coating material are formed sequentially in the growth chamber 3 without removing the substrate 8. This is achieved using different Knudsen ovens 21, 22 and operating the shutters 23, 24 as appropriate.

For example an infra red lens component may have a Ge substrate coated with layers of ZnS and ThF$_4$.

When growing layers of oxide or other refractory materials using the sputtering system the loading chamber 1 is pumped to $10^{-8}$ mb and held for a time to give adequate degassing. This may be assisted by heating the substrate. Argon gas is flowed into the loading chamber and the cryopump 10 operated to maintain a vacuum around $5.10^{-3}$ mb. The substrate 8 is then appropriately heated (e.g. 200°–500° C.) and a glow discharge established to sputter material from a target material onto the substrate 8. Small quantities of reactive gases (e.g. oxygen for oxides) may be added to the sputtering atmosphere to maintain stoichiometry of the deposited film.

Preferably the sputtering is performed in a chamber connected direct to the growth chamber 3 via gates to avoid atmospheric contamination.

We claim:

1. A method of coating optical component substrate comprising the steps of arranging the substrate in a vacuum chamber, cleaning the component whilst holding the pressure below $10^{-4}$ millibar and the partial pressure of H$_2$O and carbonaceous gases below $4.10^{-9}$ mb, applying at least one layer of a coating material to the substrate, whilst holding the pressure below $10^{-8}$ and the partial pressure of H$_2$O and carbonaceous gases below $4.10^{-9}$ mb.

2. The method of claim 1 wherein the cleaning step and the coating step are carried out in different vacuum chambers.

3. The method of claim 1 wherein, prior to the cleaning step under vacuum, the substrate is loaded into an initial loading chamber and degassed.

4. The method of claim 1 wherein the substrate is cleaned by ion beam bombardment.

5. The method of claim 1 wherein the substrate is cleaned by neutral atom bombardment.

6. The method of claim 1 wherein the substrate is cleaned by laser beam evaporation.

7. The method of claim 1 wherein the substrate is cleaned by heating.

8. The method of claim 1 wherein the optical component is a material selected from the group, halides, chalcogenide, Ge, Si, Al$_2$O$_3$, MgO$_2$, AlON, GaAs.

9. The method of claim 1 wherein the coating material is at least one material selected from the group oxide, chloride, fluoride, sulphide, selenide, telluride, boride, phosphide, carbide, carbon, nitride, arsenide, bromide, iodide or thallium containing materials.

* * * * *